United States Patent [19]

Hearn et al.

[11] Patent Number: 4,518,877
[45] Date of Patent: May 21, 1985

[54] PRECISION ABSOLUTE VALUE AMPLIFIER FOR A PRECISION VOLTMETER

[75] Inventors: William E. Hearn, Berkeley; Donald J. Rondeau, El Sobrante, both of Calif.

[73] Assignee: The United States of America as represented by the United States Department of Energy, Washington, D.C.

[21] Appl. No.: 435,157

[22] Filed: Oct. 19, 1982

[51] Int. Cl.³ .......................... H03K 5/22; G06G 7/12
[52] U.S. Cl. ................................. 307/490; 307/494; 328/26
[58] Field of Search ............... 307/490, 494, 495, 530; 328/26, 32, 112

[56] References Cited

U.S. PATENT DOCUMENTS 3,736,515  5/1973  Kadron et al. ..................... 328/143
3,851,259  11/1974  Porawski ............................ 328/143

OTHER PUBLICATIONS

"A Precision Programmable Bipolar V/f Instrumentation Module", DOE Technical Report No. LBL-13417, Lawrence Berkeley Laboratory, University of California, Oct. 21-23, 1981 at the Nuclear Science Symposium.
Electronic Design Notes, Jerald Graeme, 1/20/75, pp. 45-47.

Primary Examiner—S. D. Miller
Assistant Examiner—B. P. Davis
Attorney, Agent, or Firm—Clifton E. Clouse, Jr.; Roger S. Gaither; Judson R. Hightower

[57] ABSTRACT

Bipolar inputs are afforded by the plus inputs of first and second differential input amplifiers. A first gain determining resister is connected between the minus inputs of the differential amplifiers. First and second diodes are connected between the respective minus inputs and the respective outputs of the differential amplifiers. First and second FETs have their gates connected to the outputs of the amplifiers, while their respective source and drain circuits are connected between the respective minus inputs and an output lead extending to a load resister. The output current through the load resister is proportional to the absolute value of the input voltage difference between the bipolar input terminals. A third differential amplifier has its plus input terminal connected to the load resister. A second gain determining resister is connected between the minus input of the third differential amplifier and a voltage source. A third FET has its gate connected to the output of the third amplifier. The source and drain circuit of the third transistor is connected between the minus input of the third amplifier and a voltage-frequency converter, constituting an output device. A polarity detector is also provided, comprising a pair of transistors having their inputs connected to the outputs of the first and second differential amplifiers. The outputs of the polarity detector are connected to gates which switch the output of the voltage-frequency converter between up and down counting outputs.

11 Claims, 4 Drawing Figures

PRECISION ABSOLUTE VALUE AMPLIFIER FOR A PRECISION VOLTMETER

The United States Government has rights in this invention pursuant to Contract No. DE-AC03-76SF00098 between the United States Department of Energy and the University of California.

DESCRIPTION

Field of the Invention

This invention relates generally to a precision absolute value amplifier which will find many applications, but is particularly applicable to a precision voltmeter of the type utilizing a voltage-to-frequency converter, for converting the variable input voltage to be measured into a signal having a fixed magnitude but a variable frequency which is proportional to the voltage to be measured. The variable frequency signal may be converted into digital form by a counter or the like.

BACKGROUND OF THE INVENTION

This invention relates to improvements in precision voltmeters of the type having a bipolar analog input and a digital output indicating the voltage and sign of the differential input. Thus, the voltmeter provides a digital output indicating the difference between the voltages at the two terminals of the bipolar input, and the sign of such difference. Such a precision voltmeter may utilize a series of stages, comprising a differential input amplifier affording a bipolar input, an absolute value amplifier, a voltage-to-frequency converter, a gate system operable by a polarity detector, and an up-down counter which counts up for one polarity and down for the opposite polarity. The voltage-to-frequency converter converts a variable voltage signal into a variable frequency signal. The frequency of the output signal is directly proportional to the voltage of the input signal. The gate system switches the variable frequency signal to the up counter input for one polarity and to the down counter input for the opposite polarity.

SUMMARY OF THE INVENTION

One object of the present invention is to provide a new and improved precision bipolar absolute value amplifier for a precision voltmeter of the foregoing character.

A further object is to provide a new and improved precision absolute value amplifier which combines the functions of providing a bipolar or differential input and providing an amplified output which is proportional to the absolute value of the input, while also incorporating a polarity detector for operating the gate system for the voltage-to-frequency converter.

Another object is to provide such a new and improved precision absolute value amplifier having a greatly reduced number of components to increase the precision of the amplifier by reducing the number of sources for error, while also minimizing the cost of the amplifier.

To accomplish these and other objects, the present invention preferably provides an absolute value amplifier for a precision voltmeter or the like, comprising first and second differential input amplifier devices having plus and minus inputs, such plus inputs affording bipolar input terminals for the amplifier, a gain determining resistor connected between the minus inputs of the differential input amplifier devices, first and second diodes connected between the respective minus inputs and the respective outputs of the differential input amplifier devices, an output terminal for the amplifier, first and second transistors having respective output connections connected between the respective minus inputs and the output terminal, the transistors having respective input connections connected to the respective outputs of the amplifier devices, and load means for supplying output current to the output terminal, the output current being proportional to the absolute value of the input voltage between the input terminals.

Each of the transistors is preferably of the FET type, having such output connections in the form of a source and a drain and having such input connection in the form of a gate.

The gain determining resistor is preferably changeable in resistance to change the gain of the amplifier.

The load means may include a load resistor connected to a voltage source for developing an output voltage proportional to the output current.

The amplifier preferably comprises a third differential amplifier device having a plus input connected to the previously mentioned output terminal, the third differential amplifier device having a minus input, a second gain determining resistor connected between such minus input and the voltage source, feedback means connected between the output of such third differential amplifier and the minus input thereof, and output means connected to the output of the third differential amplifier device.

Such feedback means preferably comprises a third transistor having output connections connected between the last mentioned minus input and the output means, such third transistor having an input connection connected to the output of the third differential amplifier device.

The third transistor is preferably in the form of an FET having its output connections in the form of a source and a drain, such FET having such input connection in the form of a gate connected to the output of the third differential amplifier device.

Such output means preferably comprises an additional load resistor connected between the third transistor and a voltage source.

The second gain determining resistor is preferably changeable in resistance for changing the gain of the amplifier.

A voltage-to-frequency converter is preferably connected to the output means for producing an output signal having a frequency which is proportional to the absolute value of the input voltage between the bipolar input terminals.

The amplifier preferably comprises two different output circuits, gating means for switching the output of such converter between the two different output circuits, and polarity responsive means connected between the outputs of the first and second differential amplifier devices and such gating means for switching such gating means in response to changes in the polarity of the input voltage across the bipolar input terminals.

BRIEF DESCRIPTION OF THE DRAWINGS

Further objects, advantages and features of the present invention will appear from the following description, taken with the accompanying drawings, in which.

DETAILED DESCRIPTION OF THE ILLUSTRATIVE EMBODIMENT

Figure 1:
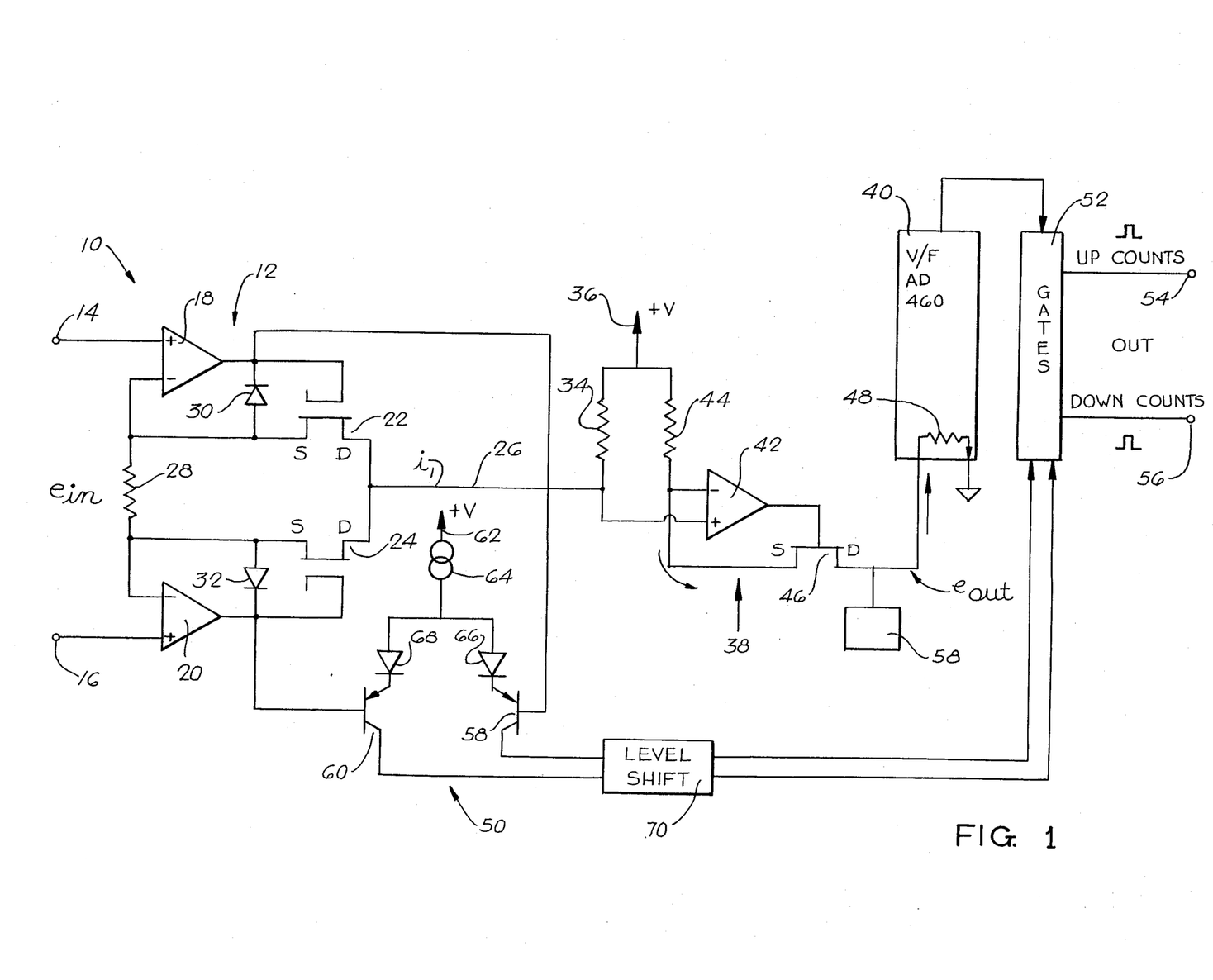
FIG. 1 is a simplified schematic diagram of a precision bipolar absolute value amplifier to be described as an illustrative embodiment of the present invention.

As just indicated, FIG. 1 illustrates a precision bipolar absolute value amplifier 10 to be described as an illustrative embodiment of the present invention. The amplifier 10 combines the functions of a bipolar input amplifier, an absolute value amplifier, and a comparator in a way which reduces error and minimizes the number of parts and the complexity of the circuit. As shown, the amplifier 10 comprises a first stage 12 which is a bipolar absolute value transconductance amplifier stage. The output current of the first stage 12 is unipolar and precisely proportional to the absolute value of the input voltage, whether the polarity of the input voltage is positive or negative.

The first or input stage 12 has bipolar input terminals 14 and 16 which are balanced relative to ground. The analog input voltage to be measured is applied between the bipolar input terminals 14 and 16. The polarity of the input voltage between the terminals 14 and 16 may be either positive or negative. In this case, the magnitude of the voltage at the input terminals 14 and 16 may be as much as plus or minus ten volts. The amplifier 10 is adapted to respond to the difference between the voltages at the bipolar input terminals 14 and 16.

The first amplifier stage 12 employs first and second operational or differential amplifiers 18 and 20 which may be in the form of commercially available integrated circuit modules. For example, the differential amplifiers 18 and 20 may be Intersil type ICL 7660 chopper-stabilized operational amplifiers.

Each of the differential amplifiers 18 and 20 has plus and minus inputs which are non-inverting and inverting respectively. It will be seen that the respective plus inputs of the amplifiers 18 and 20 are connected to the bipolar input terminals 14 and 16. The minus inputs are employed for negative or inverse feedback.

The first amplifier stage 12 also employs first and second transistors 22 and 24, each of which is preferably a field effect transistor (FET). More specifically, each of the transistors 22 and 24 is preferably an N-channel enhancement mode V-mos FET, such as type 2N6661. As shown, the gates of the FETs 22 and 24 are connected to the respective outputs of the operational amplifiers 18 and 20. The gates provide input connections to the transistors 22 and 24.

The first amplifier stage 12 has an output lead or terminal 26 which is connected to the drain terminals of the FETs 22 and 24. The source terminals of the FETs 22 and 24 are connected to the minus inputs of the operational amplifiers 18 and 20. The source and drain terminals of the transistors 22 and 24 serve as output connections for the transistors.

A first gain determining resistor 28 is connected between the respective minus input terminals of the operational amplifiers 18 and 20. The gain determining resistor 28 is preferably changeable or adjustable in value to make range changes in the gain of the first amplifier stage 12.

The first stage 12 also comprises first and second diodes 30 and 32 which are connected between the respective minus input terminals and the respective outputs of the operational amplifiers 18 and 20.

The first amplifier stage 12 includes load means in the form of a load resistor 34, connected between the output lead 26 and a power supply terminal 36, which may deliver approximately plus 24 volts, for example.

The first amplifier stage 12 acts as a transconductance amplifier having a bipolar input and a unipolar output, in the form of an output current $i_1$ in the output lead 26 and the load resistor 34. The output current $i_1$ is directly proportional to the voltage difference between the bipolar input terminals 14 and 16, whether such difference is positive or negative in polarity. The load resistor 34 produces an output voltage which is proportional to the output current $i_1$. Thus, the first amplifier stage 12 acts as a combination rectifier and amplifier.

The amplifier 10 also includes a second stage 38 which acts as a current amplifier or mirror, to drive the input of a voltage-to-frequency converter 40. As shown, the second stage 38 comprises an operational or differential amplifier 42 which may be in the form of an integrated circuit or module. Preferably, the operational amplifier 42 may be of the same type as the amplifiers 18 and 20. As shown, the output lead 26 from the first stage 12 is connected to the plus or non-inverting input of the operational amplifier 42. The minus or inverting input of the amplifier 42 is employed for negative or inverse feedback and is supplied with current by a resistor 44 connected between the minus input and the power supply terminal 36, which may supply plus 24 volts. The resistor 44 acts as a second gain determining resistor, and may be changeable or adjustable in value, to change the gain range of the second stage 38.

It will be seen that the second stage 38 includes a third transistor 46 which may be in the form of an FET, having its source and drain connected between the minus input of the operational amplifier 42 and the input of the voltage-frequency converter 40. As shown, the converter 40 has an input resistance 48 which may be connected between the input and ground. The second stage 38 produces a variable output current which flows through the second gain determining resistor 44, the source and drain of the FET 46, and the input resistance 48 of the voltage-frequency converter 40. The gate of the FET 46 is connected to the output of the operational amplifier 42. Preferably, the FET 46 is of the P-channel junction type, such as type No. 2N2608.

The first and second stages 12 and 38 produce a unipolar voltage across the input resistance 48 of the voltage-frequency converter 40, such voltage being precisely proportional to the difference between the input voltages at the bipolar input terminals 14 and 16, whether such difference is positive or negative in polarity. The converter 40 converts its input voltage into an output signal having a frequency which is precisely proportional to such input voltage.

The amplifier 10 also preferably includes a polarity detector 50 which operates in cooperation with the first stage 12, to detect whether the input difference voltage is positive or negative in polarity, and to perform switching functions at the output of the voltage-frequency converter 40. Thus, the polarity detector 50 may operate a gate system 52, adapted to switch the output of the converter 40 between an up counting output 54 and a down counting output 56. Such outputs 54 and 56 may be connected to the inputs of an up-down counter, for example.

When the polarity of the input difference voltage between the terminals 14 and 16 changes, the polarity of the outputs of the operational amplifiers 18 and 20 also changes with a snap action. The outputs of the amplifiers 18 and 20 are employed to operate the polarity detector 50.

As shown, the polarity detector 50 comprises a pair of transistors 58 and 60 having their input electrodes connected to the respective outputs of the operational amplifiers 18 and 20. In this case, the bases of the transistors 58 and 60 serve as the input electrodes. Operating power for the transistors 58 and 60 is provided by a power supply terminal 62, which may be at plus 24 volts, for example. Current is carried from the power supply terminal 62 by a constant current diode 64 and a pair of diodes 66 and 68, connected to the respective emitters of the transistors 58 and 60. A level shifting circuit 70 has its inputs connected to the collectors of the transistors 58 and 60. The outputs of the level shifting circuit 70 are connected to the inputs of the gate system 52. The outputs of the level shifting circuit 70 are alternately energized, depending upon whether the polarity of the difference voltage between the input terminals 14 and 16 is positive or negative.

Thus, when the voltage difference between the input terminals 14 and 16 is positive, the polarity detector 50 and the gate system 52 may be operative to switch the output of the voltage-frequency converter 40 to the up counter output terminal 54. When such voltage difference is negative, the polarity detector 50 and the gate system 52 may be operative to switch upward the converter 50 to the down counter output 56.

In the operation of the precision bipolar absolute value amplifier 10, the first stage acts as an absolute value transconductance amplifier having an ouput current which is unipolar and precisely proportional to the absolute value of the input voltage difference between the input terminals 14 and 16. In the typical case, the input offsets and the input currents of the operational amplifiers 18 and 20 are inconsequential and can be neglected. The gain of each amplifier 18 and 20 is very large. For a positive input voltage difference between the terminals 14 and 16, the feedback action forces sufficient current through the first transistor 22, the first gain determining resistor 28, and the second diode 32 to establish a voltage equal to the input voltage across the gain determining resistor 28. For a negative input voltage difference between the terminals 14 and 16, the feedback action forces sufficient current through the second transistor 24, the first gain determining resistor 28, and the first diode 30 to establish a voltage equal to the input voltage, but of the opposite polarity, across the first gain determining resistor 28.

In either case, a unipolar output signal current $i_1$ is produced in the output lead 26. The transconductance gain of the first stage 12 can be written as follows:

$$g_{m1} = \frac{i_1}{|e_{in}|} = \frac{1}{R_{G1}}. \quad (1)$$

In this equation $R_{G1}$ is the resistance of the gain determining resistor 28. Because the output current $i_1$ flows through the load resistor 34 having a resistance value $R_1$, the voltage gain of the first stage 12 is as follows:

$$G_1 = g_{m1} \cdot R_1 = \frac{i_1}{|e_{in}|} \cdot R_1 = \frac{R_1}{R_{G1}} \; v/v \quad (2)$$

The second stage acts as a precision "current mirror", and can also be analyzed as a transconductance amplifier with an output load resistor. The feed back action of the high gain operational amplifier 42 establishes a voltage across the second gain determining resistor 44 equal to the input voltage developed across the load resistor 34. All of the output current through the gain determining resistor 44 and the FET 46 flows into the voltage-frequency converter 40 and through its input resistor 48 having a resistance value $R_2$. Thus, the gain $G_2$ of the second stage 38 can be written as follows:

$$G_2 = g_{m2} \cdot R_2 = \frac{1}{R_{G2}} \cdot R_2 = \frac{R_2}{R_{G2}} \; v/v \quad (3)$$

The overall gain of the first and second stages 12 and 38 can be written as follows:

$$G = \frac{e_o}{|e_{in}|} = G_1 \cdot G_2 = \frac{R_1}{R_{G1}} \cdot \frac{R_2}{R_{G2}} \; v/v \quad (4)$$

It will be noted that the voltage-frequency converter 40 is current driven at its voltage input. This arrangement eliminates one stage in the overall system and provides a convenient test point 58.

The overall gain of the bipolar absolute value amplifier 10 is easily adjusted over a range of 10,000 to 1 by switching different values of the first and second gain determining resistors 28 and 44. The values of the first resistor 28 may be switched in decades, while the values of the second resistor 44 may be switched to achieve multipliers of 1, 2 and 5. The gain of the bipolar input stage 12 is determined by the value of the first resistor 28 for both positive and negative input polarities, with the result that the gain of the input stage 12 is very nearly identical for both polarities.

Figure 2A:
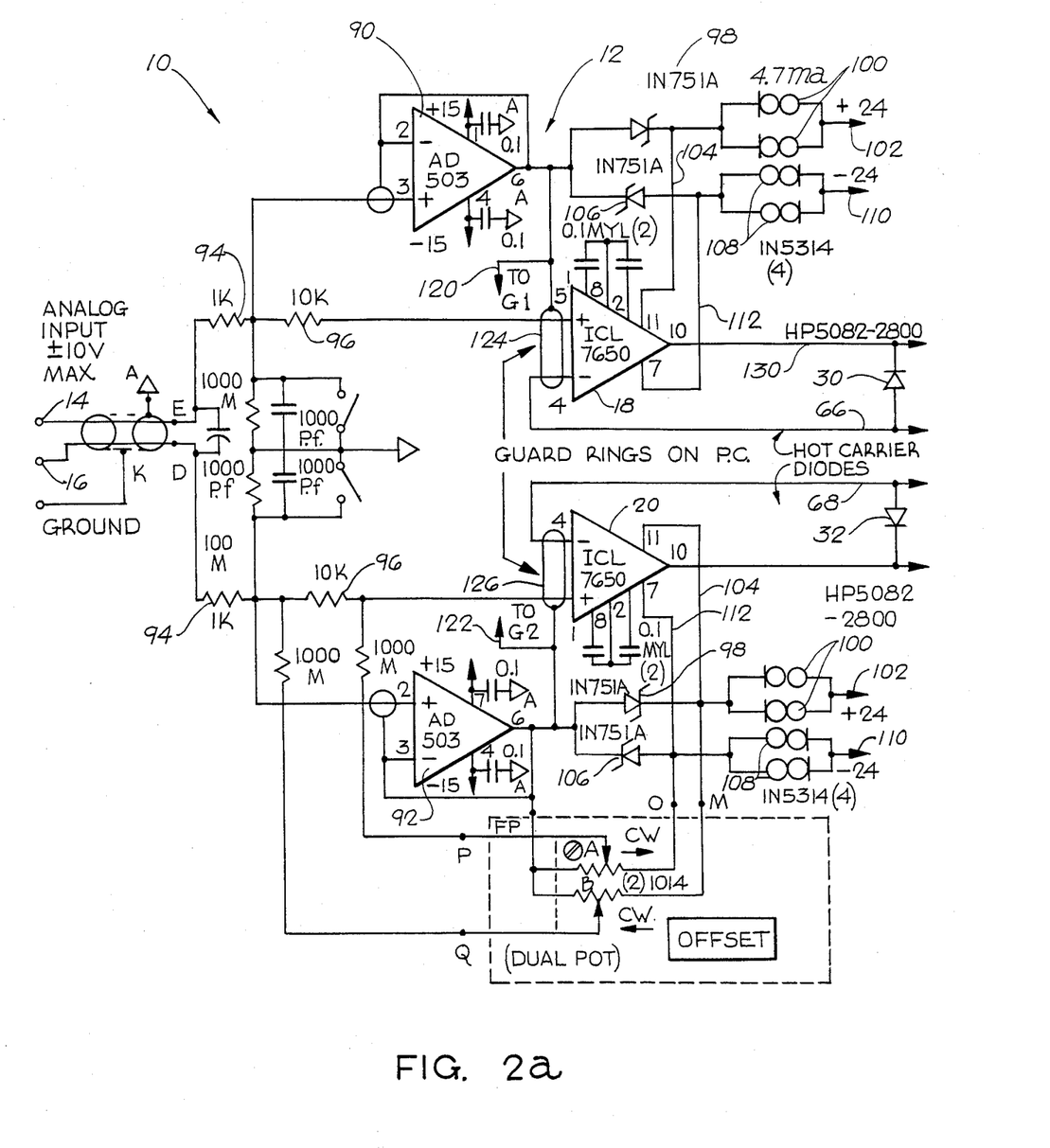
FIGS. 2a, 2b & 2c, taken together, constitute a detailed circuit diagram of the precision bipolar absolute value amplifier of FIG. 1.
Figure 2B:
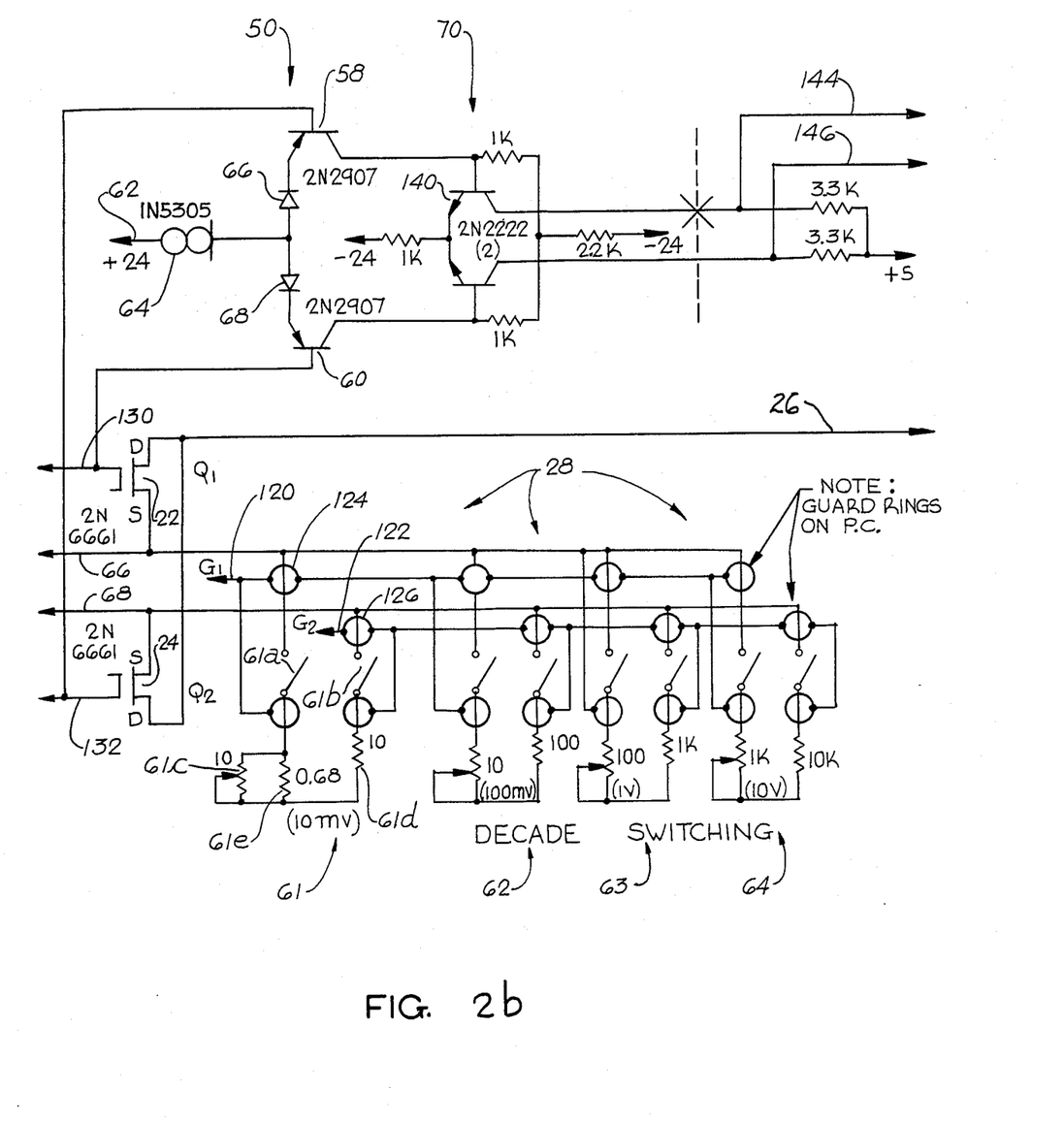
Figure 2C:
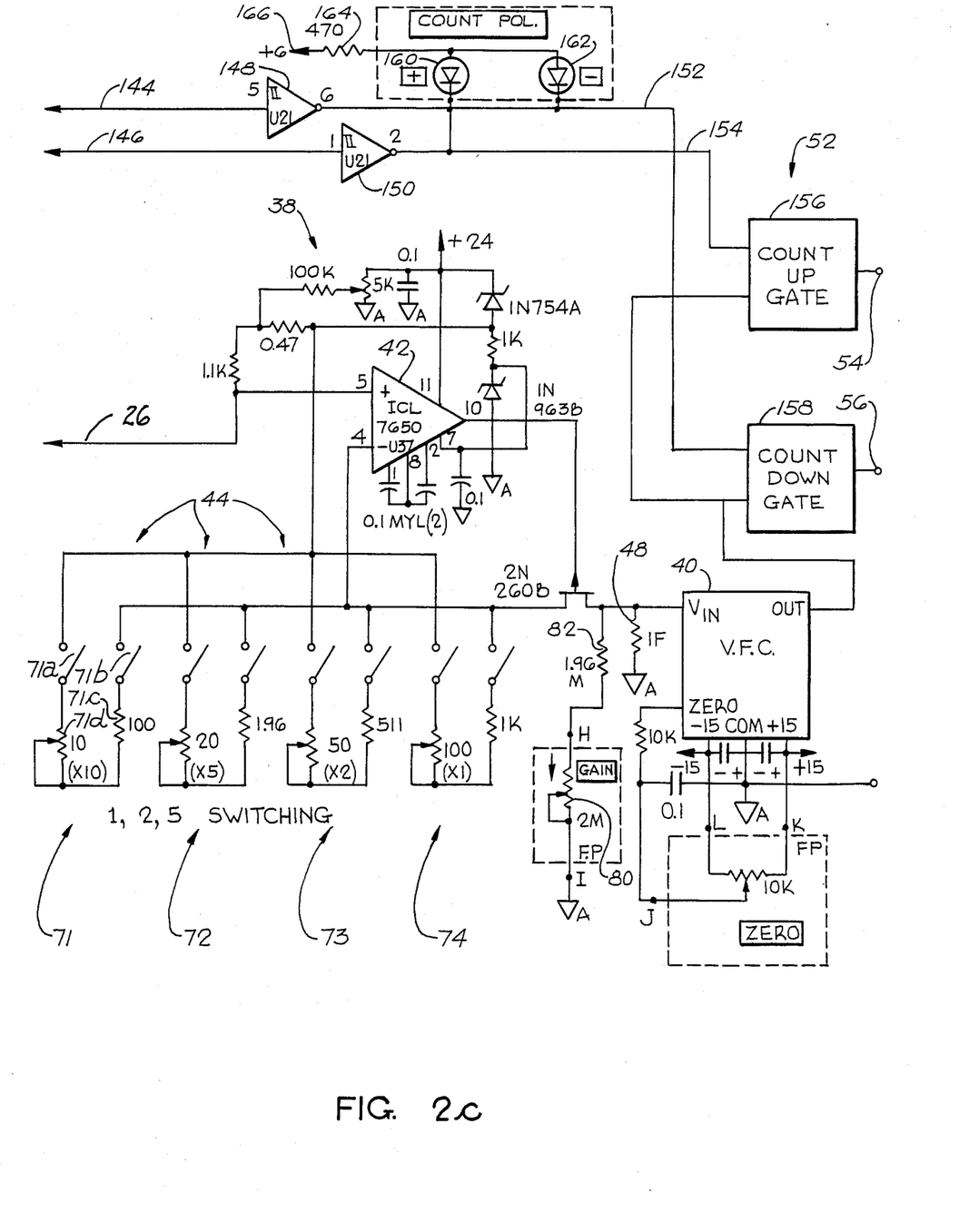

FIGS. 2a, 2b and 2c, when assembled side by side in sequence, constitute a schematic circuit diagram, showing additional details of the bipolar absolute value amplifier 10. The circuit employs various resistors and capacitors which need not be described, because they perform conventional functions. The decade switching arrangement for the first gain determining resistor 28 is shown in FIG. 2b. The decade switching system includes four selectively operable switching circuits 61, 62, 63 and 64, to provide input voltage ranges of 0 to 10 millivolts, 100 millivolts, 1 volt and 10 volts. Only the first switching circuit 61 need be described in detail, because the others 62, 63 and 64 are very similar, except that the values of the resistors differ by factors of 10, or approximately so.

The decade switching circuits 61–64 are connected between leads 66 and 68 which extends from the minus inputs of the operational amplifiers 18 and 20 in FIG. 2a, to the switching circuits 61–64 in FIG. 2b. The first switching circuit 61 is a series circuit comprising switches 61a and 61b, a variable resistor 61c and a fixed resistor 61d, plus another fixed resistor 61e which is shunted across the resistor 61c. The switches 61a and 61b may be operated by relays or by manually operable switching controls. The fixed resistor 61d provides a major portion of the resistance in the circuit, while the variable resistor 61c provides a calibration or trimming adjustment. For example, the fixed resistor 61d may have a value of 10 ohms, while the shunting resistor 61e may have a value of 0.68 ohm. The variable resistor 61c may be adjustable from 0 to 10 ohms.

Each of the other decade switching circuits 62, 63 and 64 include a variable resistor and a fixed resistor, but the second shunting fixed resistor is not used. The respective fixed resistors may have values of 100, 1,000 and 10,000 ohms, while the variable resistors may have values of 10, 100 and 1,000 ohms. Thus, the resistance value of the first gain determining resistor 28 may be switched in decade ranges between approximately 10 ohms and approximately 10,000 ohms.

The range switching system for the second gain determining resistor 44 is shown in FIG. 2c. As shown, the switching system comprises four switching circuits 71, 72, 73, and 74, which are selectively operable and are connected between a power supply lead 76 and a lead 78, extending to the minus input terminal of the operational amplifier 42. Only the first switching circuit 71 need be described in detail, because the other switching circuits 72–74 are similar, except for the values of the resistors, which are related by a sequence of multipliers, such as 1, 2, 5 and 10.

The first switching circuit 71 is in the form of a series circuit, comprising switches 71a and 71b, a fixed resistor 71c, and a variable resistor 71d. The switches may be operated by relays or by manually operable switching controls. The fixed resistor 71c provides a major portion of the resistance in the circuit, while the variable resistor 71d provides a calibration or trimming adjustment. Thus, the fixed resistor 71c may have a value of 100 ohms, while the variable resistor 71d may have a value of 10 ohms.

The other switching circuits 72, 73 and 74 include respective fixed resistors which may have values of 196, 511 and 1,000 ohms, and respective variable resistors having values of 20, 50 and 100 ohms.

The voltage-frequency converter 40 is shown in FIG. 2c. The input resistance 48 is shown separately, but is actually within the voltage-frequency converter module, in the usual case. The converter 40 may be in the form of a commercially available integrated circuit, such as type AD460, made by Analog Devices. This converter provides an output having a frequency of 1 megahertz at full scale. Other integrated circuits may also be employed. For example, for an output frequency of 100 kilohertz at full scale, a converter type AD 458, also made by Analog Devices may be employed. Voltage-frequency converter modules made by Digital Components Corporation, types 8610 and 8710, may also be employed to provide output frequencies of 5 and 10 megahertz at full scale.

To provide a calibration or trimming adjustment of the gain, a variable resistor 80 may be provided, as shown in FIG. 2c. The variable resistor 80 is connected in series with a fixed resistor 82, and the series combination is connected in parallel with the input resistance 48. The values of the resistors 80 and 82 may be very high, relative to the value of the resistance 48, so that the variable resistor 80 has only a minor effect. For example, the resistance 48 may have a value of 10,000 ohms, while the resistors 80 and 82 have values of 2 megohms and 1.96 megohms, respectively.

In the first and second stages 12 and 38 of the amplifier 10, the performance of the operational amplifiers 18, 20 and 42 is critical. These operational amplifiers need to have microvolt offsets, picoamp input currents, low drift, high gain, low noise and good alternating current response. Various commercially available integrated circuits may be employed. For example, one suitable operational amplifier is Intersil type ICL 7650 chopper stabilized operational amplifier. This high performance integrated circuit has a combined input offset voltage and temperature drift approaching only plus or minus 1 microvolt over a temperature range from 10° to 50° C. A limitation of this amplifier resides in the fact that it operates on power supplies of plus and minus 5 volts and thus cannot accommodate a very wide range of differential and common mode input levels. It is desirable to accommodate a level range of plus or minus 10 volts.

In the circuit of FIG. 2a, this problem is solved by providing two additional operational amplifiers 90 and 92, whereby the power supply voltages for the main operational amplifiers 18 and 20 are bootstrapped or caused to float at variable levels, centered about the input voltages to the operational amplifiers 18 and 20. The operational amplifiers 90 and 92 may comprise commercially available integrated circuits, such as Analog Devices type AD503, which utilize junction FETs.

It will suffice to describe the arrangement of the operational amplifier 90, in relation to the operational amplifier 18. The arrangement of the operational amplifier 92, in relation to the operational amplifier 20, is the same. Thus, the operational amplifier 90 has a plus input which receives the input voltage from the input terminal 14 through a protective resistor 94 of low value. The main amplifier 18 receives the input voltage through the resistor 94 and also through a second protective resistor 96 of low value. The minus input of the amplifier 90 is connected directly to the output of the amplifier to provide inverse feedback, so that the amplifier 90 acts as a voltage follower, having an output voltage corresponding to its input voltage at the plus input. This output voltage establishes the center voltage for the floating supply voltages, which are plus and minus 5 volts, above and below the center voltage, to the amplifier 18. The plus 5 volt supply is provided by a series circuit comprising a 5 volt Zener diode 98 and two parallel connected constant current diodes 100, connected between the output of the amplifier 90 and a power supply terminal 102 at plus 24 volts. The plus 5 volt supply is carried to the amplifier 18 by a lead 104 connected to the junction between the Zener diode 98 and the constant current diodes 100.

The minus 5 volt supply is provided by a series circuit comprising a 5 volt Zener diode 106 and two parallel connected constant current diodes 108, connected between the output of the amplifier 90 and a power supply terminal 110 at minus 24 volts. The minus 5 volt supply is carried to the amplifier 18 by a lead 112 connected to the junction between the Zener diode 106 and the diodes 108.

To minimize the effects of current leakage, the outputs of the amplifiers 90 and 92 are connected to leads 120 and 122 which extend to various guard rings or conductors 124 and 126, adjacent critical leads on the printed circuit boards. The leads 120 and 122 extend to FIG. 2b, where additional guard rings 124 and 126 will be found.

Leads 130 and 132 are connected to the outputs of the operational amplifiers 18 and 20. Such leads 130 and 132 extend between FIGS. 2a and 2b.

The polarity detector circuit 50 is shown in FIG. 2b, including the transistors 58 and 60, connected the same as in FIG. 1. As shown in FIG. 2b, the level shifting circuit 70 may compromise two additional transistors 140 and 142, connected in voltage following circuits. The outputs of the transistors 140 and 142 are connected to leads 144 and 146 which extend between FIGS. 2b and 2c.

In FIG. 2c, inverters 148 and 150 are connected between the respective polarity detector leads 144 and 146 and leads 152 and 154, extending to the output gate system 52, which is shown as two separate gates 156 and 158, designated count up and count down. The leads 152 and 154 provide the control signals for the gates 156 and 158, respectively, while the variable frequency signals are supplied to both gates 156 and 158 by the voltage-frequency converter 40. The inverters 148 and 150 may be in the form of Schmitt triggers.

It is preferred to provide means for indicating the counting polarity, as determined by the polarity detector circuit 50. As shown in FIG. 2c, such indicator means may compromise light emitting diodes 160 and 162, connected between the respective leads 152 and 154 and a resistor 164 which extends to a power supply terminal 166. The light emitting diode (LED) 160 indicates a positive input polarity which produces an up count. The LED 162 indicates a minus input polarity which produces a down count.

The polarity detector circuit 50, in combination with the input operational amplifiers 18 and 20, provide unambiguous polarity information to the output gate system 52, because the polarity detector circuit is responsive to the outputs of the operational amplifiers 18 and 20. When the input polarity changes, such outputs switch polarity with a snap action, through a dead zone of over one volt. Due to this snap action, the transistors 58 and 60 of the polarity detecting circuit 50 do not need to be matched. Even without matching, the polarity detecting circuit provides polarity indicating output signals which are free from ambiguities.

The precision bipolar absolute value amplifier of the present invention, in combination with the voltage-frequency converter, provides an extremely advantageous, high performance precision voltmeter which is highly versatile and will find many important applications. For example, the voltmeter is well adapted for measuring the voltage output of a rotary magnetic pickup coil for use in measuring the intensity and distribution of magnetic fields.

The precision voltmeter provides a full scale frequency range of 1 megahertz, or even higher in some cases. By switching the values of the gain determining resistors, a series of input ranges can be achieved from one millivolt to ten volts, for example. Even lower voltage ranges can be achieved by using a preamplifier.

The voltmeter has a wide common mode capability, such as plus or minus 10 volts, for example, and a good common mode rejection ratio, such as 100 db. A resolution of better than 5 microvolts is achieved.

High accuracy is also achieved. For higher voltage ranges, the accuracy may be plus or minus 0.01 percent. For lower voltage ranges, the accuracy may be plus or minus 0.5 percent. The precision voltmeter provides a digital output which is unambiguous as to polarity.

The present invention utilizes a minimum number of components and stages, so that there is a minimum number of sources of possible error. The same gain determining resistors are employed for both input polarities. Moreover, the same voltage-frequency converter is employed for both polarities. These factors make it possible to achieve a high order of accuracy and consistency, as well as low temperature drift. The voltmeter achieves good sensitivity and resolution, yet is highly cost-effective.

We claim:

1. An absolute value amplifier for a precision voltmeter or the like, comprising first and second differential input amplifier devices having plus and minus inputs, said plus inputs affording bipolar input terminals for said amplifier, a gain determining resistor connected between said minus inputs of said differential input amplifier devices, first and second diodes connected between the respective minus inputs and the respective outputs of said differential input amplifier devices, an output terminal for said amplifier, first and second transistors having respective output connections connected between the respective minus inputs and said output terminal, said transistors having respective input connections connected to the respective outputs of said amplifier devices, and load means for supplying output current to said output terminal, said output current being proportional to the absolute value of the input voltage between said input terminals, said load means comprising a load resistor connected between said output terminal and a voltage source, said amplifier comprising a third differential amplifier device having a plus input connected said output terminal, said third differential amplifier device having a minus input, a second gain determining resistor connected between said last-mentioned minus input and said voltage source, feedback means connected between the output of said third differential amplifier device and said minus input, and output means connected to the output of said third differential amplifier device, said feedback means comprising a third transistor having output connections between said last-mentioned minus input and said output means, said third transistor having an input connection connected to the output of said third differential amplifier device.

2. An amplifier according to claim 1, in which each of said transistors is of the FET type, having said output connections in the form of a source and a drain and having said input connection in the form of a gate.

3. An amplifier according to claim 1, in which said diodes are of the hot carrier type.

4. An amplifier according to claim 1, in which said resistor is changeable in resistance to change the gain of said amplifier.

5. An amplifier according to claim 1, in which said third transistor is in the form of an FET having said output connections in the form of a source and a drain, said last-mentioned FET having said input connection in the form of a gate connected to the output of said third differential amplifier device.

6. An amplifier according to claim 1, said output means comprising an additional load resistor connected between said third transistor and a voltage source.

7. An amplifier according to claim 1, in which said second gain determining resistor is changeable in resistance for changing the gain of said amplifier.

8. An amplifier according to claim 1, including a voltage-to-frequency converter connected to said output means for producing an output signal having a frequency which is proportional to the absolute value of the input voltage between the bipolar input terminals.

9. An amplifier according to claim 8, including two different output circuits, gating means for switching the output of said converter between said two different output circuits, and polarity responsive means connected between the outputs of said first and second differential amplifier devices and said gating means for switching said gating means in response to changes in the polarity of the input voltage across said bipolar input terminals.

10. An amplifier according to claim 9, said polarity responsive means comprising a pair of transistors having their inputs connected to the outputs of said first and second differential amplifier devices, and means connecting the outputs of said last mentioned transistors to said gating means.

11. An amplifier according to claim 1, including power supply floating circuits connected to the power supply inputs of said first and second differential input amplifier devices and affording floating power supplies for said devices, said power supply floating circuits including a pair of operational amplifiers connected as voltage followers and connected between said respective bipolar input terminals and the power supply inputs for said first and second differential input amplifier devices.

* * * * *